US011610919B2

(12) United States Patent
Choi et al.

(10) Patent No.: US 11,610,919 B2
(45) Date of Patent: Mar. 21, 2023

(54) DISPLAY DEVICE AND METHOD OF MANUFACTURING THE SAME

(71) Applicant: Samsung Display Co., Ltd., Yongin-si (KR)

(72) Inventors: Jonghoon Choi, Hwaseong-si (KR); Jongoh Seo, Seoul (KR); Ji-Hwan Kim, Hwaseong-si (KR); Jongjun Baek, Seoul (KR); Byung Soo So, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/240,847

(22) Filed: Apr. 26, 2021

(65) Prior Publication Data

US 2022/0045107 A1 Feb. 10, 2022

(30) Foreign Application Priority Data

Aug. 6, 2020 (KR) .......................... 10-2020-0098678

(51) Int. Cl.
*H01L 27/12* (2006.01)
(52) U.S. Cl.
CPC ........ *H01L 27/1237* (2013.01); *H01L 27/127* (2013.01); *H01L 27/1222* (2013.01)
(58) Field of Classification Search
CPC ............. H01L 27/1237; H01L 27/1222; H01L 27/127; H01L 27/1218; H01L 27/1233; H01L 27/156; H01L 27/3262; H01L 27/3258; H01L 29/78651; H01L 51/56; H01L 2251/558; G09G 3/32
See application file for complete search history.

(56) References Cited

U.S. PATENT DOCUMENTS

2007/0284584 A1* 12/2007 Chan .................... H01L 27/1281
257/E27.111
2008/0087889 A1* 4/2008 Chan .................... H01L 27/1237
257/40

FOREIGN PATENT DOCUMENTS

| JP | 4738602 | 8/2011 |
| KR | 10-0553744 B1 | 2/2006 |
| KR | 10-0761346 B1 | 9/2007 |
| KR | 10-2007-0109195 A | 11/2007 |
| KR | 10-2020-0058622 A | 5/2020 |

* cited by examiner

*Primary Examiner* — Mohammed R Alam
(74) *Attorney, Agent, or Firm* — Lewis Roca Rothgerber Christie LLP (57) ABSTRACT

A display device may include a substrate, a buffer layer on the substrate, a first active pattern on the buffer layer, the first active pattern having a first thickness, a second active pattern on the buffer layer spaced from the first active pattern and having a second thickness smaller than the first thickness, a first gate insulating layer on the first active pattern and the second active pattern, a first gate electrode on the first gate insulating layer, the first gate electrode overlapping the first active pattern, and a second gate electrode on the first gate insulating layer, the second gate electrode overlapping the second active pattern.

9 Claims, 10 Drawing Sheets

DISPLAY DEVICE AND METHOD OF MANUFACTURING THE SAME

CROSS-REFERENCE TO RELATED APPLICATION

This application claims priority to and the benefit of Korean Patent Application No. 10-2020-0098678, filed on Aug. 6, 2020 in the Korean Intellectual Property Office (KIPO), the entire disclosure of which is incorporated herein by reference.

BACKGROUND

1. Field

Embodiments relate to a display device. More particularly, embodiments relate to a display device including a plurality of transistors and a method of manufacturing the display device.

2. Description of Related Art

A display device may include a light emitting element configured to emit light to display an image. The light emitting element may include electrodes facing each other and a light emitting layer disposed therebetween.

The display device may include a plurality of transistors including a driving transistor, a switching transistor, and the like to provide a driving current to the light emitting element. The driving transistor and the switching transistor may have different functions. Accordingly, it is desirable to improve characteristics of the driving transistor and characteristics of the switching transistor in different schemes.

SUMMARY

Aspects of one or more embodiments are directed towards a display device in which characteristics of transistor(s) are improved and a method of manufacturing the display device.

A display device according to one or more embodiments may include a substrate, a buffer layer on the substrate, a first active pattern on the buffer layer, the first active pattern having a first thickness, a second active pattern on the buffer layer, spaced from the first active pattern, and having a second thickness smaller than the first thickness, a first gate insulating layer on the first active pattern and the second active pattern, a first gate electrode on the first gate insulating layer, the first gate electrode overlapping the first active pattern, and a second gate electrode on the first gate insulating layer, the second gate electrode overlapping the second active pattern.

In one or more embodiments, a value obtained by subtracting the second thickness from the first thickness may be greater than 0 and less than about 60 Å.

In one or more embodiments, the first thickness may be about 300 Å to about 500 Å.

In one or more embodiments, a distance from the substrate to a bottom surface of the first active pattern may be substantially equal to a distance from the substrate to a bottom surface of the second active pattern.

In one or more embodiments, a top surface of the buffer layer may be flat.

In one or more embodiments, a distance from the substrate to a top surface of the first active pattern may be substantially equal to a distance from the substrate to a top surface of the second active pattern.

In one or more embodiments, the buffer layer may have a trench that overlaps the first active pattern.

In one or more embodiments, the display device may further include a second gate insulating layer on the first gate electrode and the second gate electrode and a capacitor electrode on the second gate insulating layer, the capacitor electrode overlapping the first gate electrode.

In one or more embodiments, the display device may further include a conductive pattern between the substrate and the buffer layer, the conductive pattern overlapping the first active pattern.

In one or more embodiments, each of the first active pattern and the second active pattern may include polycrystalline silicon.

A method of manufacturing a display device according to one or more embodiments may include forming an amorphous silicon layer on a substrate on which a first region and a second region spaced from each other are defined, partially etching the second region of the amorphous silicon layer, crystallizing the amorphous silicon layer to form a polycrystalline silicon layer, etching all regions of the polycrystalline silicon layer except for the first region and the second region to form a first polycrystalline silicon pattern and a second polycrystalline silicon pattern in the first region and the second region, respectively, forming a first gate insulating layer on the first polycrystalline silicon pattern and the second polycrystalline silicon pattern, and forming a first gate electrode and a second gate electrode that overlap the first polycrystalline silicon pattern and the second polycrystalline silicon pattern, respectively, on the first gate insulating layer.

In one or more embodiments, the partially etching of the second region of the amorphous silicon layer may include partially etching the second region of the amorphous silicon layer to a thickness greater than 0 and less than about 60 Å.

In one or more embodiments, the forming of the amorphous silicon layer may include forming the amorphous silicon layer to a thickness of about 300 Å to about 500 Å.

In one or more embodiments, the method may further include washing the amorphous silicon layer with hydrofluoric acid after the partially etching of the second region of the amorphous silicon layer and before the crystallizing of the amorphous silicon layer.

In one or more embodiments, the crystallizing of the amorphous silicon layer may include irradiating the amorphous silicon layer by a laser having a constant energy density.

A method of manufacturing a display device according to one or more embodiments may include forming a buffer layer on a substrate on which a first region and a second region spaced from each other are defined, partially etching the first region of the buffer layer, forming an amorphous silicon layer on the buffer layer, polishing the amorphous silicon layer, crystallizing the amorphous silicon layer to form a polycrystalline silicon layer, etching all regions of the polycrystalline silicon layer except for the first region and the second region to form a first polycrystalline silicon pattern and a second polycrystalline silicon pattern in the first region and the second region, respectively, forming a first gate insulating layer on the first polycrystalline silicon pattern and the second polycrystalline silicon pattern, and forming a first gate electrode and a second gate electrode that overlap the first polycrystalline silicon pattern and the second polycrystalline silicon pattern, respectively, on the first gate insulating layer.

In one or more embodiments, the polishing of the amorphous silicon layer may include polishing the amorphous silicon layer to a thickness greater than 0 and less than about 60 Å.

In one or more embodiments, the forming of the amorphous silicon layer may include forming the amorphous silicon layer to a thickness of about 300 Å to about 500 Å.

In one or more embodiments, the method may further include washing the amorphous silicon layer with hydrofluoric acid, after the polishing of the amorphous silicon layer and before the crystallizing of the amorphous silicon layer.

In one or more embodiments, the crystallizing of the amorphous silicon layer may include irradiating the amorphous silicon layer by a laser having a constant energy density.

In the display device according to the embodiments, the thicknesses of the active patterns of the first and second transistors may be different from each other, so that characteristics of the transistors having different functions from each other may be improved.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Hereinafter, display devices in accordance with embodiments of the present disclosure will be described in more detail with reference to the accompanying drawings. Like reference numerals in the drawings denote like elements throughout, and duplicative descriptions thereof may not be provided.

The terminology used herein is for the purpose of describing particular example embodiments only and is not intended to limit the example embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1:
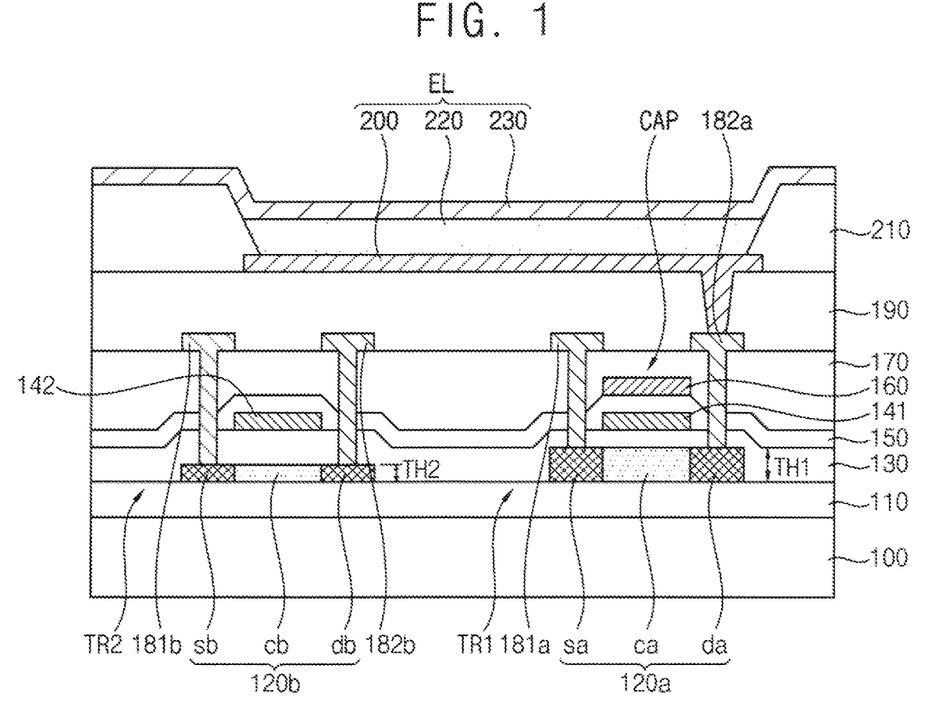
FIG. 1 is a cross-sectional view showing a display device according to one or more embodiments of the present disclosure.

FIG. 1 is a cross-sectional view showing a display device according to one or more embodiments of the present disclosure.

Referring to FIG. 1, according to one or more embodiments of the present disclosure, a display device may include a substrate 100, a buffer layer 110, a first active pattern 120a, a second active pattern 120b, a first gate insulating layer 130, a first gate electrode 141, a second gate electrode 142, a second gate insulating layer 150, a capacitor electrode 160, an interlayer insulating layer 170, a first source electrode 181a, a first drain electrode 182a, a second source electrode 181b, a second drain electrode 182b, a planarization layer 190, a first electrode 200, a pixel defining layer 210, a light emitting layer 220, and a second electrode 230.

The substrate 100 may be a transparent insulating substrate. For example, the substrate 100 may be formed of glass, quartz, plastic, and/or the like. When the substrate 100 is formed of the plastic, the substrate 100 may include a plurality of organic layers.

The buffer layer 110 may be disposed on the substrate 100. The buffer layer 110 may block impurities from being introduced through the substrate 100. In addition, the buffer layer 110 may provide or have a flat surface and the buffer layer 110 may be on an upper portion of the substrate 100. The buffer layer 110 may be formed of an inorganic insulating material such as silicon nitride, silicon oxide, and/or silicon oxynitride.

The first active pattern 120a and the second active pattern 120b may be disposed on the buffer layer 110. The first active pattern 120a and the second active pattern 120b may be spaced from (e.g., spaced apart from) each other. Each of the first active pattern 120a and the second active pattern 120b may be formed of polycrystalline silicon.

The first active pattern 120a may include a first channel region ca, and a first source region sa and a first drain region da that are disposed at respective ends of the first channel region ca. The first source region sa and the first drain region da may be doped with P-type or N-type impurities, and the first channel region ca may be doped with impurities of a type that is different from a type of the impurities of the first source region sa and the first drain region da. In one or more embodiments, the first source region sa and the first drain region da may be doped with P-type impurities, and the first channel region ca may be doped with N-type impurities.

The second active pattern 120b may include a second channel region cb, and a second source region sb and a second drain region db that are disposed at respective ends of the second channel region cb. The second source region sb and the second drain region db may be doped with P-type or N-type impurities, and the second channel region cb may be doped with impurities of a type that is different from a type of the impurities of the second source region sb and the second drain region db. In one or more embodiments, the second source region sb and the second drain region db may be doped with P-type impurities, and the second channel region cb may be doped with N-type impurities.

The first active pattern 120a may have a first thickness TH1, and the second active pattern 120b may have a second thickness TH2 that is smaller or less than the first thickness TH1. The first thickness TH1 may be a vertical distance from a bottom surface of the first active pattern 120a to a top surface of the first active pattern 120a, and the second thickness TH2 may be a vertical distance from a bottom surface of the second active pattern 120b to a top surface of the second active pattern 120b.

In one or more embodiments, a value obtained by subtracting the second thickness TH2 from the first thickness TH1 may be greater than 0 and less than about 60 Å. In one or more embodiments, the first thickness TH1 may be about 300 Å to about 500 Å.

In one or more embodiments, a distance from the substrate 100 to the bottom surface of the first active pattern 120a may be substantially the same as or substantially equal to a distance from the substrate 100 to the bottom surface of the second active pattern 120b. For example, a top surface of the buffer layer 110 may be flat, and the bottom surface of first active pattern 120a and the bottom surface of second active pattern 120b may be on the top surface of the buffer layer 110 which may be flat. In this case, because the second thickness TH2 is smaller or less than the first thickness TH1, a distance from the substrate 100 to the top surface of the first active pattern 120a may be greater than a distance from the substrate 100 to the top surface of the second active pattern 120b.

The first gate insulating layer 130 may be disposed on the first active pattern 120a and the second active pattern 120b. The first gate insulating layer 130 may be formed on the buffer layer 110 to cover the first active pattern 120a and the second active pattern 120b. The first gate insulating layer 130 may be formed of an inorganic insulating material such as silicon nitride, silicon oxide, and/or silicon oxynitride.

The first gate electrode 141 and the second gate electrode 142 may be disposed on the first gate insulating layer 130. The first gate electrode 141 may overlap the first active pattern 120a, and the second gate electrode 142 may overlap the second active pattern 120b. For example, the first gate electrode 141 may overlap the first channel region ca, and the second gate electrode 142 may overlap the second channel region cb. Each of the first gate electrode 141 and the second gate electrode 142 may be formed of a conductive material such as molybdenum (Mo), copper (Cu), aluminum (Al), and/or titanium (Ti).

The first active pattern 120a and the first gate electrode 141 may form a first transistor TR1. The second active pattern 120b and the second gate electrode 142 may form a second transistor TR2. In one or more embodiments, the first transistor TR1 may function as a driving transistor configured to generate a driving current, and the second transistor TR2 may function as a switching transistor configured to provide a data signal to the first transistor TR1.

The second gate insulating layer 150 may be disposed on the first gate electrode 141 and the second gate electrode 142. The second gate insulating layer 150 may be formed on the first gate insulating layer 130 to cover the first gate electrode 141 and the second gate electrode 142. The second gate insulating layer 150 may be formed of an inorganic insulating material such as silicon nitride, silicon oxide, and/or silicon oxynitride.

The capacitor electrode 160 may be disposed on the second gate insulating layer 150. The capacitor electrode 160 may overlap the first gate electrode 141. The capacitor electrode 160 may be formed of a conductive material such as molybdenum (Mo), copper (Cu), aluminum (Al), and/or titanium (Ti). The first gate electrode 141 and the capacitor electrode 160 may form a capacitor CAP.

The interlayer insulating layer 170 may be disposed on the capacitor electrode 160. The interlayer insulating layer 170 may be formed on the second gate insulating layer 150 to cover the capacitor electrode 160. The interlayer insulating layer 170 may be formed of an inorganic insulating material such as silicon nitride, silicon oxide, and/or silicon oxynitride, and/or an organic insulating material such as polyimide (PI).

The first source electrode 181a, the first drain electrode 182a, the second source electrode 181b, and the second drain electrode 182b may be disposed on the interlayer insulating layer 170. The first source electrode 181a may be connected (e.g., electrically connected) to the first source region sa, and the first drain electrode 182a may be connected (e.g., electrically connected) to the first drain region da. The second source electrode 181b may be connected (e.g., electrically connected) to the second source region sb, and the second drain electrode 182b may be connected (e.g., electrically connected) to the second drain region db.

The first source electrode 181a, the first drain electrode 182a, the second source electrode 181b, and the second drain electrode 182b may make contact with (i.e., contact) the first source region sa, the first drain region da, the second source region sb, and the second drain region db, respectively, through contact holes formed in the first gate insulating layer 130, the second gate insulating layer 150, and the interlayer insulating layer 170. Each of the first source electrode 181a, the first drain electrode 182a, the second source electrode 181b, and the second drain electrode 182b may be formed of a conductive material such as molybdenum (Mo), copper (Cu), aluminum (Al), and/or titanium (Ti).

The planarization layer 190 may be disposed on the first source electrode 181a, the first drain electrode 182a, the second source electrode 181b, and the second drain electrode 182b. The planarization layer 190 may be formed on the interlayer insulating layer 170 to cover the first source electrode 181a, the first drain electrode 182a, the second source electrode 181b, and the second drain electrode 182b. The planarization layer 190 may be formed of an organic insulating material such as polyimide (PI).

The first electrode 200 may be disposed on the planarization layer 190. The first electrode 200 may be connected (e.g., electrically connected) to the first drain electrode 182a. The first electrode 200 may contact the first drain electrode 182a through a contact hole formed in the planarization layer 190. The first electrode 200 may be formed of a conductive material such as a metal, an alloy, or transparent conductive oxide. For example, the conductive material may include silver (Ag), indium tin oxide (ITO), and/or the like.

The pixel defining layer 210 may be disposed on the first electrode 200. The pixel defining layer 210 may be disposed on the planarization layer 190 to cover the first electrode 200. The pixel defining layer 210 may have a pixel opening that exposes at least a part of the first electrode 200. In one or more embodiments, the pixel opening may expose a central portion of the first electrode 200, and the pixel defining layer 210 may cover a peripheral portion of the first electrode 200. The pixel defining layer 210 may be formed of an organic insulating material such as polyimide (PI).

The light emitting layer 220 may be disposed on the first electrode 200. The light emitting layer 220 may be disposed on the first electrode 200 exposed by the pixel opening. The light emitting layer 220 may include at least one of an organic light emitting material or a quantum dot.

In one or more embodiments, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, and/or the like, and the high molecular weight organic compound may include poly (3,4-ethylenedioxythiophene), polyaniline, poly-phenylenevinylene, polyfluorene, and/or the like.

In one or more embodiments, the quantum dot may include a core including a group II-VI compound, a group III-V compound, a group IV-VI compound, a group IV element, a group IV compound, and a combination thereof. In one or more embodiments, the quantum dot may have a core-shell structure including a core and a shell surrounding the core. The shell may serve as a protective layer for maintaining semiconductor characteristics by preventing or substantially preventing chemical modification of the core, and serve as a charging layer for imparting electrophoretic characteristics to the quantum dot.

The second electrode 230 may be disposed on the light emitting layer 220. In one or more embodiments, the second electrode 230 may also be disposed on the pixel defining layer 210. The second electrode 230 may be formed of a conductive material such as a metal, an alloy, and/or transparent conductive oxide. For example, the conductive material may include aluminum (Al), platinum (Pt), silver (Ag), magnesium (Mg), gold (Au), chromium (Cr), tungsten (W), titanium (Ti), and/or the like. The first electrode 200, the light emitting layer 220, and the second electrode 230 may form a light emitting element EL. The light emitting element EL may emit light based on the driving current transmitted from the first transistor TR1.

The thickness of the first active pattern 120a may be related to characteristics of the first transistor TR1, and the thickness of the second active pattern 120b may be related to characteristics of the second transistor TR2. For example, when the thickness of the first active pattern 120a increases, hysteresis and ΔDR of the first transistor TR1 may be decreased so as to attenuate an instantaneous afterimage of the display device, and when the thickness of the second active pattern 120b decreases, an off-current ($I_{off}$) of the second transistor TR2 may be decreased. In this case, ΔDR may refer to a difference between a driving range of the first transistor TR1 during forward swing and a driving range of the first transistor TR1 during reverse swing. However, in a related art display device, because the thickness of the first active pattern 120a and the thickness of the second active pattern 120b are substantially the same or substantially equal, the off-current of the second transistor TR2 may be increased when the hysteresis and ΔDR of the first transistor TR1 decrease, and the hysteresis and ΔDR of the first transistor TR1 may be increased when the off-current of the second transistor TR2 decreases.

However, in the display device according to the present embodiment, because the second thickness TH2 of the second active pattern 120b is smaller or less than the first thickness TH1 of the first active pattern 120a, the hysteresis and ΔDR of the first transistor TR1 may be decreased, and concurrently (e.g., simultaneously), the off-current of the second transistor TR2 may be decreased. Accordingly, the characteristics of the first transistor TR1 and the characteristics of the second transistor TR2 may be improved.

FIGS. 2-8 are cross-sectional views showing a method of manufacturing a display device according to one or more embodiments of the present disclosure. For example, FIGS. 2-8 may show a method of manufacturing the display device of FIG. 1.

Figure 2:
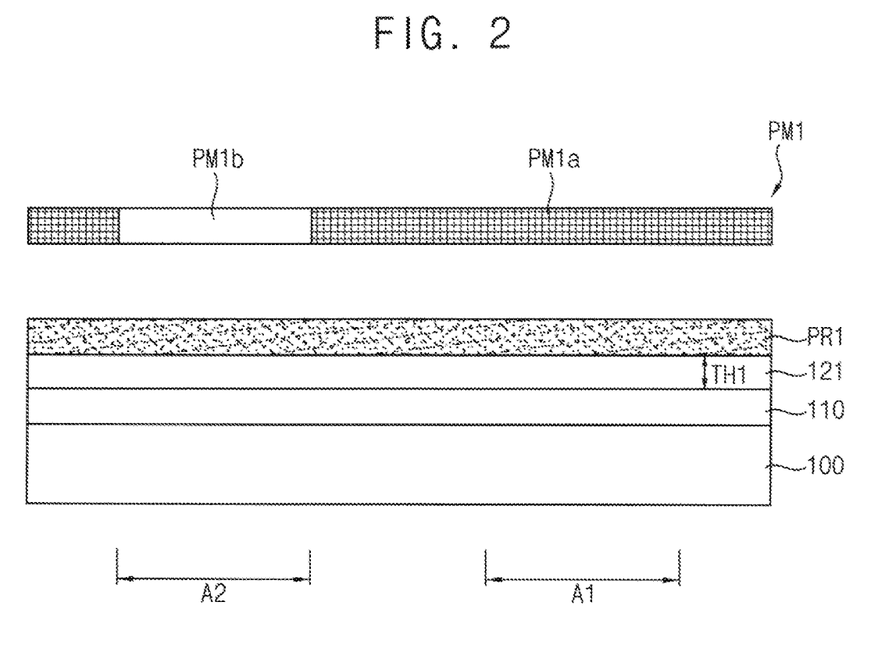
FIGS. 2-8 are cross-sectional views showing a method of manufacturing a display device according to one or more embodiments of the present disclosure.

Referring to FIG. 2, the buffer layer 110 may be formed on the substrate 100. A first region A1 and a second region A2 spaced from (e.g., spaced apart from) each other may be defined on the substrate 100. The first region A1 may refer to a region on which the first active pattern 120a is formed, and the second region A2 may refer to a region on which the second active pattern 120b is formed.

Then, an amorphous silicon layer 121 may be formed on the buffer layer 110. The amorphous silicon layer 121 may have a first thickness TH1. In one or more embodiments, the first thickness TH1 may be about 300 Å to about 500 Å.

Next, a photoresist layer PR1 may be formed on the amorphous silicon layer 121. In one or more embodiments, the photoresist layer PR1 may include a positive-type photoresist. However, the present disclosure is not limited thereto. For example, in other embodiments, the photoresist layer PR1 may include a negative-type photoresist with suitable changes to the processes described herein.

In one or more embodiments, a photomask PM1 may be between the photoresist layer PR1 and a light source to cover portions of the photoresist layer PR1. For example, the photomask PM1 may be disposed on or above the photoresist layer PR1. The photomask PM1 may include a light blocking part PM1a and a light transmitting part PM1b. When the photoresist layer PR1 includes the positive-type photoresist, the light transmitting part PM1b may overlap the second region A2.

Figure 3:
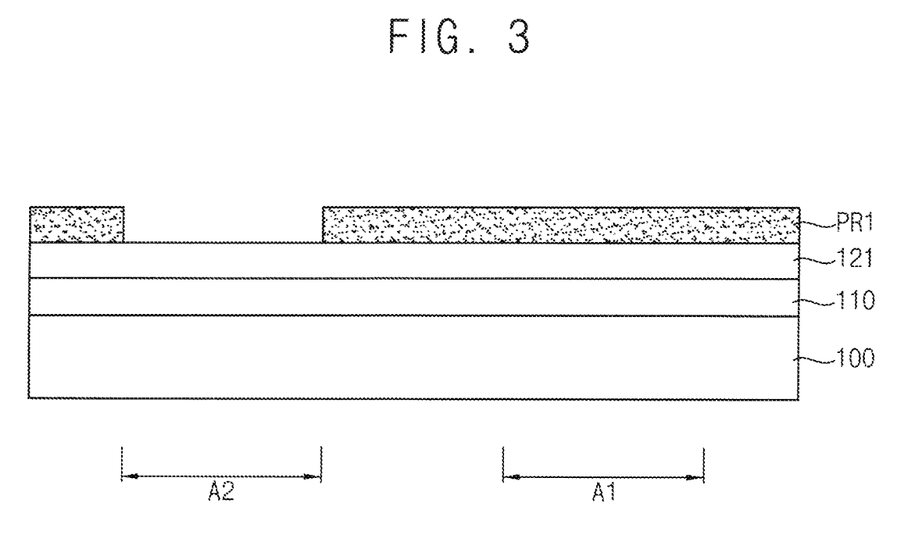

Referring to FIG. 3, portions of the photoresist layer PR1 may be exposed (e.g., exposed to light) by using the photomask PM1. For example, the portions of the photoresist layer PR1 that overlap the light transmitting part PM1b may be exposed and the portions of the photoresist layer PR1 that overlap the light blocking part PM1a may remain unexposed. Then, the photoresist layer PR1 may be developed with a developer to pattern the photoresist layer PR1. In this case, a portion of the photoresist layer PR1 that overlaps the light transmitting part PM1b may be removed. In other words, in the case of a positive-type photoresist, the portion of the photoresist layer PR1 that is exposed may be removed by the developer.

Figure 4:
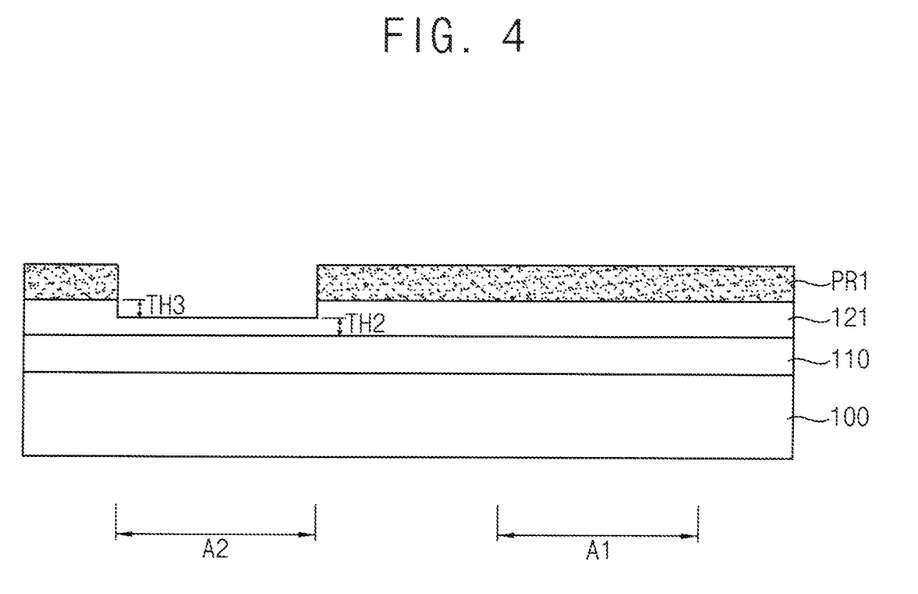

Referring to FIG. 4, the second region A2 of the amorphous silicon layer 121 may be partially etched (e.g., partially etched in the thickness direction of the amorphous silicon layer 121). The second region A2 of the amorphous silicon layer 121 may be exposed or not covered by the patterned photoresist layer PR1, and the second region A2 of the amorphous silicon layer 121 may be etched by a third thickness TH3 that is smaller or less than the first thickness TH1. In one or more embodiments, the third thickness TH3 may be greater than 0 and less than about 60 Å. In this case, the amorphous silicon layer 121 having a second thickness TH2 equal to a value obtained by subtracting the third thickness TH3 from the first thickness TH1 may remain in the second region A2.

Figure 5:
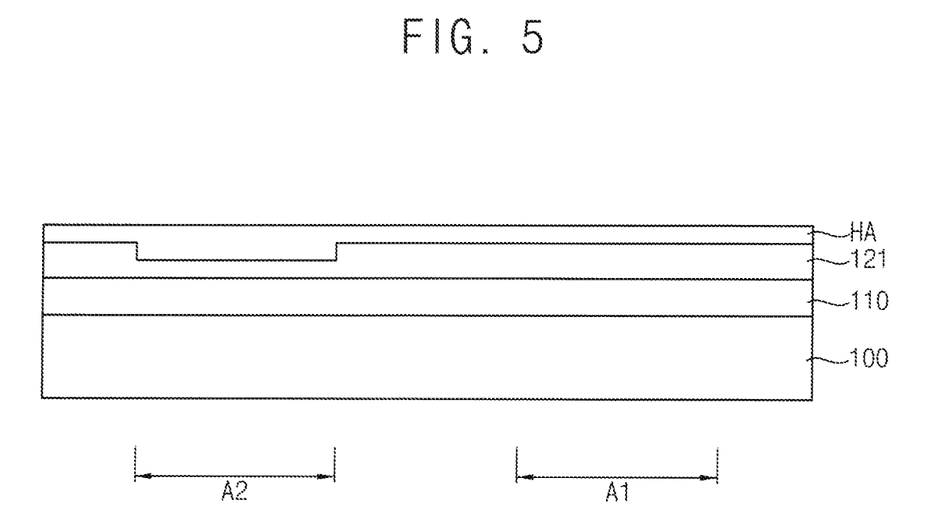

Referring to FIG. 5, the photoresist layer PR1 may be removed or stripped, and the amorphous silicon layer 121 may be washed.

In one or more embodiments, the amorphous silicon layer 121 may be washed by using a hydrofluoric acid HA. The hydrofluoric acid HA may be an aqueous solution in which hydrogen fluoride (HF) is dissolved. For example, the hydrofluoric acid HA may include about 0.5% of hydrogen fluoride. The amorphous silicon layer 121 may be washed with the hydrofluoric acid HA to remove a natural oxide film formed on the amorphous silicon layer 121.

Figure 6:
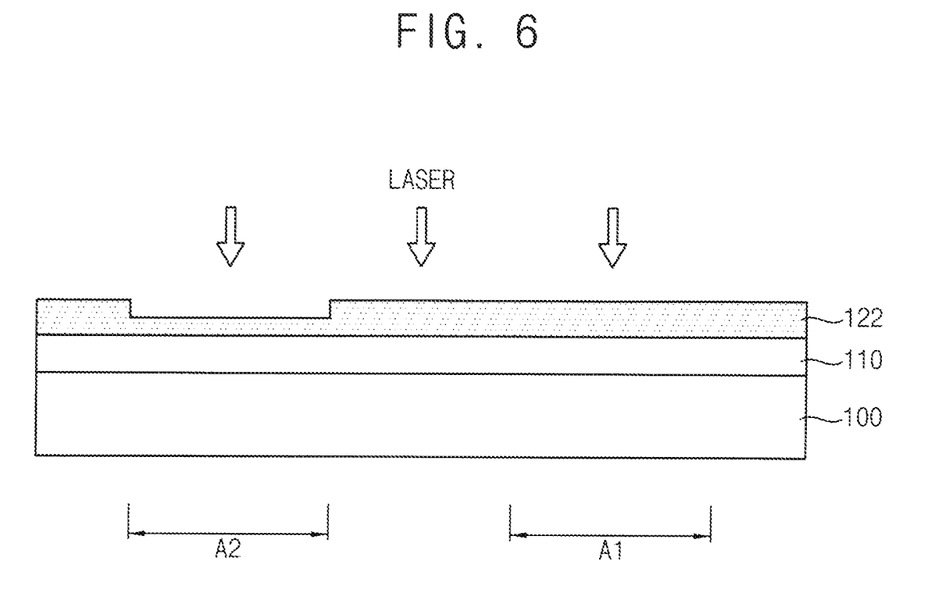

Referring to FIG. 6, the amorphous silicon layer 121 may be crystallized to form a polycrystalline silicon layer 122.

The polycrystalline silicon layer 122 may be formed by irradiating a laser onto the amorphous silicon layer 121. For example, the laser may be a short-wavelength, high-power, and highly-efficient excimer laser. For example, the excimer laser may include an inert gas, inert gas halide, mercury halide, an inert gas oxide compound, a polyatomic excimer, and/or the like. For example, the inert gas may be $Ar_2$, $Kr_2$, $Xe_2$, and/or the like, the inert gas halide may be ArF, ArCl, KrF, KrCl, XeF, XeCl, and/or the like, the mercury halide may be HgCl, HgBr, HgI, and/or the like, the inert gas oxide compound may be ArO, KrO, XeO, and/or the like, and the polyatomic excimer may be $Kr_2F$, $Xe_2F$, and/or the like.

In one or more embodiments, the amorphous silicon layer 121 may be crystallized by irradiating a laser having a constant energy density. For example, when an optimal or suitable energy density of the laser irradiated to the amorphous silicon layer 121 having the first thickness TH1 has a first range (a first lower limit to a first upper limit), and an optimal or suitable energy density of the laser irradiated to the amorphous silicon layer 121 having the second thickness TH2 has a second range (a second lower limit to a second upper limit, wherein the second lower limit is less than the first lower limit, and the second upper limit is greater than the first lower limit) that partially overlaps the first range, the amorphous silicon layer 121 may be crystallized by irradiating the laser having the constant energy density within the first lower limit to the second upper limit.

In the method of manufacturing the display device according to the present embodiment, because the amorphous silicon layer 121 is partially etched by the third thickness TH3 that is greater than 0 and less than about 60 Å, the amorphous silicon layer 121 including the first region A1 having the first thickness TH1 and the second region A2 having the second thickness TH2 may be crystallized by irradiating the laser having the constant energy density. When the amorphous silicon layer 121 is partially etched by a thickness greater than about 60 Å, because a difference between the thicknesses of the first region A1 and the second region A2 of the amorphous silicon layer 121 is greater than about 60 Å, the range of the optimal or suitable energy density of the laser irradiated onto the first region A1 of the amorphous silicon layer 121 may not overlap the range of the optimal or suitable energy density of the laser irradiated onto the second region A2 of the amorphous silicon layer 121. In this case, the amorphous silicon layer 121 may be crystallized by irradiating lasers having different energy densities from each other, and therefore, a time and a cost for crystallizing the amorphous silicon layer 121 may be increased.

Figure 7:
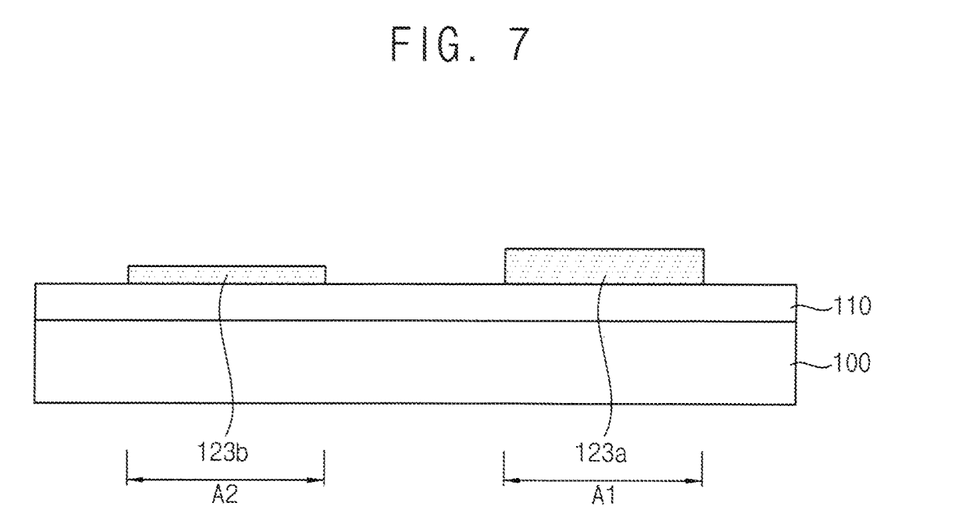

Referring to FIG. 7, all regions of the polycrystalline silicon layer 122 except for the first region A1 and the second region A2 may be etched to form a first polycrystalline silicon pattern 123a and a second polycrystalline silicon pattern 123b in the first region A1 and the second region A2, respectively. The regions of the polycrystalline silicon layer 122 except for the first region A1 and the second region A2 may be etched by the first thickness TH1. In other words, only portions of the polycrystalline silicon layer 122 located in the region A1 and the second region A2 remain.

Figure 8:
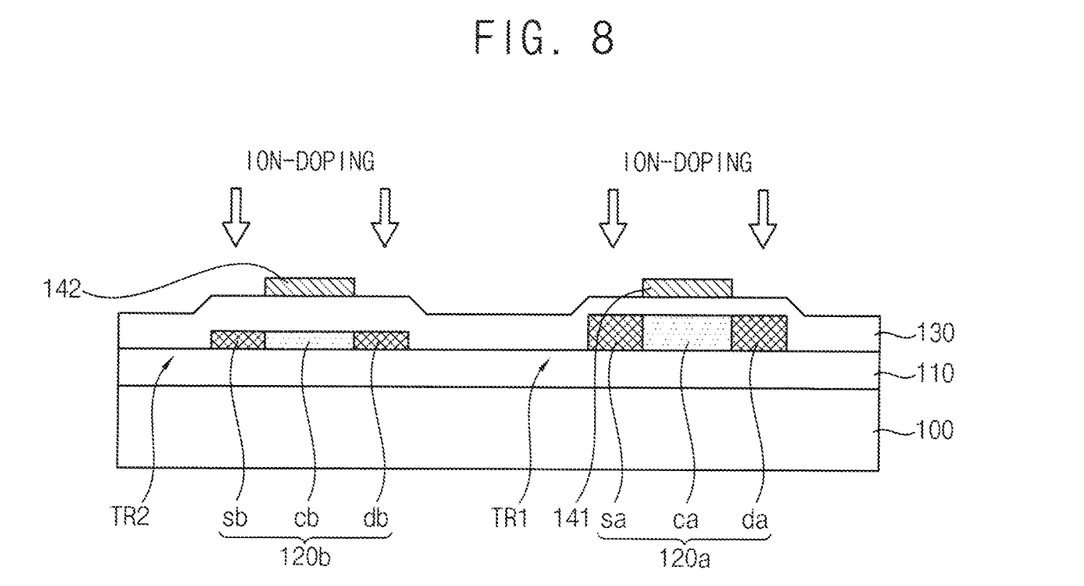

Referring to FIG. 8, the first gate insulating layer 130 may be formed on the first polycrystalline silicon pattern 123a and the second polycrystalline silicon pattern 123b, and the first gate electrode 141 and the second gate electrode 142 may be formed on the first gate insulating layer 130.

Thereafter, ions may be injected into the first polycrystalline silicon pattern 123a and the second polycrystalline silicon pattern 123b to form the first active pattern 120a and the second active pattern 120b. The first channel region ca and the second channel region cb to which ions are not injected may be formed in the first active pattern 120a and the second active pattern 120b that overlap the first gate electrode 141 and the second gate electrode 142, respectively, and the first source region sa, the first drain region da, the second source region sb, and the second drain region db may be formed by injecting ions into portions of the first active pattern 120a and portions of the second active pattern 120b that do not overlap the first gate electrode 141 and the second gate electrode 142.

Referring to FIG. 1, the second gate insulating layer 150 may be formed on the first gate electrode 141 and the second gate electrode 142, and the capacitor electrode 160 may be formed on the second gate insulating layer 150.

Then, the interlayer insulating layer 170 may be formed on the capacitor electrode 160, and contact holes may be formed in the first gate insulating layer 130, the second gate insulating layer 150, and the interlayer insulating layer 170. The contact holes may expose the first source region sa, the first drain region da, the second source region sb, and the second drain region db, respectively. Thereafter, the first source electrode 181a, the first drain electrode 182a, the second source electrode 181b, and the second drain electrode 182b that fill the contact holes, respectively, may be formed on the interlayer insulating layer 170.

Next, the planarization layer 190 may be formed on the first source electrode 181a, the first drain electrode 182a, the second source electrode 181b, and the second drain electrode 182b, and a contact hole may be formed in the planarization layer 190. The contact hole may expose the first drain electrode 182a. Thereafter, the first electrode 200 that fills the contact hole may be formed on the planarization layer 190.

Then, the pixel defining layer 210 may be formed on the first electrode 200 and the pixel opening may be formed in the pixel defining layer 210. The pixel opening may expose at least a part of the first electrode 200. Thereafter, the light emitting layer 220 may be formed on the first electrode 200 exposed by the pixel opening, and the second electrode 230 may be formed on the light emitting layer 220.

Figure 9:
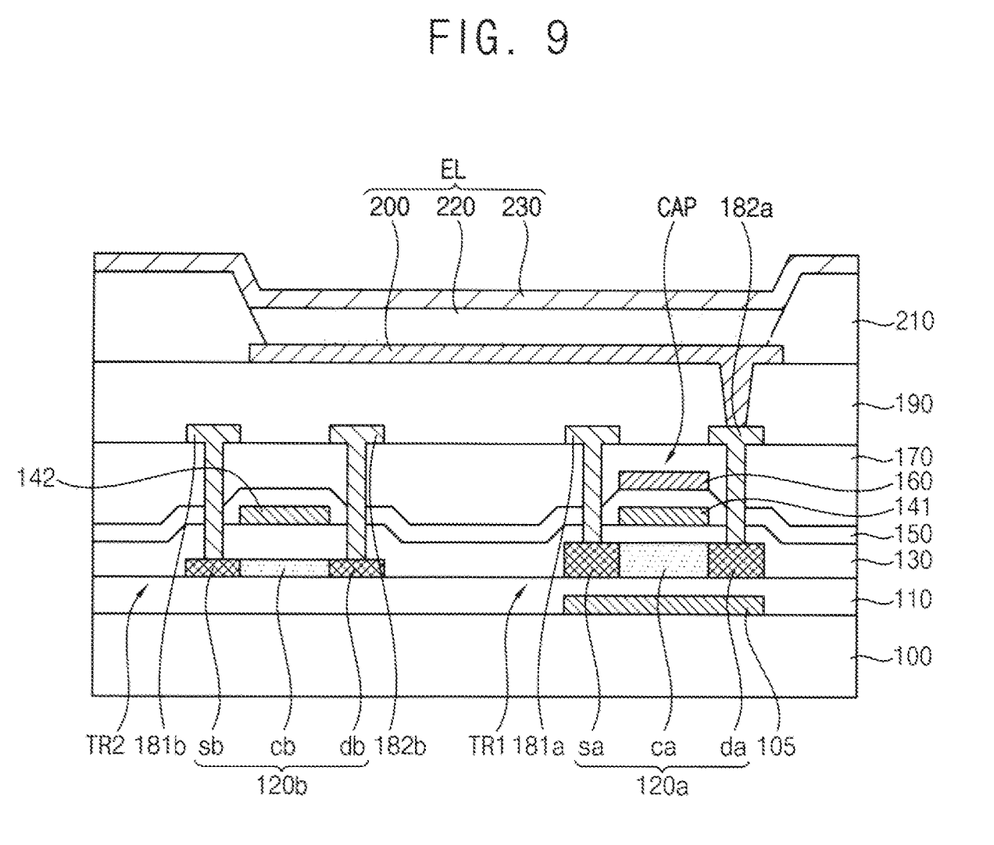
FIG. 9 is a cross-sectional view showing a display device according to one or more embodiments of the present disclosure.

FIG. 9 is a cross-sectional view showing a display device according to one or more embodiments of the present disclosure.

Referring to FIG. 9, according to one or more embodiments of the present disclosure, a display device may include a substrate 100, a conductive pattern 105, a buffer layer 110, a first active pattern 120a, a second active pattern 120b, a first gate insulating layer 130, a first gate electrode 141, a second gate electrode 142, a second gate insulating layer 150, a capacitor electrode 160, an interlayer insulating layer 170, a first source electrode 181a, a first drain electrode 182a, a second source electrode 181b, a second drain electrode 182b, a planarization layer 190, a first electrode 200, a pixel defining layer 210, a light emitting layer 220, and a second electrode 230. The display device that will be described in more detail with reference to FIG. 9 may be substantially identical or similar to the display device described with reference to FIG. 1 except that the display device of FIG. 9 further includes the conductive pattern 105. Accordingly, redundant descriptions of identical or similar components may not be repeated.

The conductive pattern 105 may be disposed between the substrate 100 and the buffer layer 110. The conductive pattern 105 may overlap the first active pattern 120a. When the conductive pattern 105 is disposed under the first active pattern 120a, the hysteresis of the first transistor TR1 may be decreased so as to attenuate the instantaneous afterimage of the display device. The conductive pattern 105 may be formed of a conductive material such as molybdenum (Mo), copper (Cu), aluminum (Al), and/or titanium (Ti).

Figure 10:
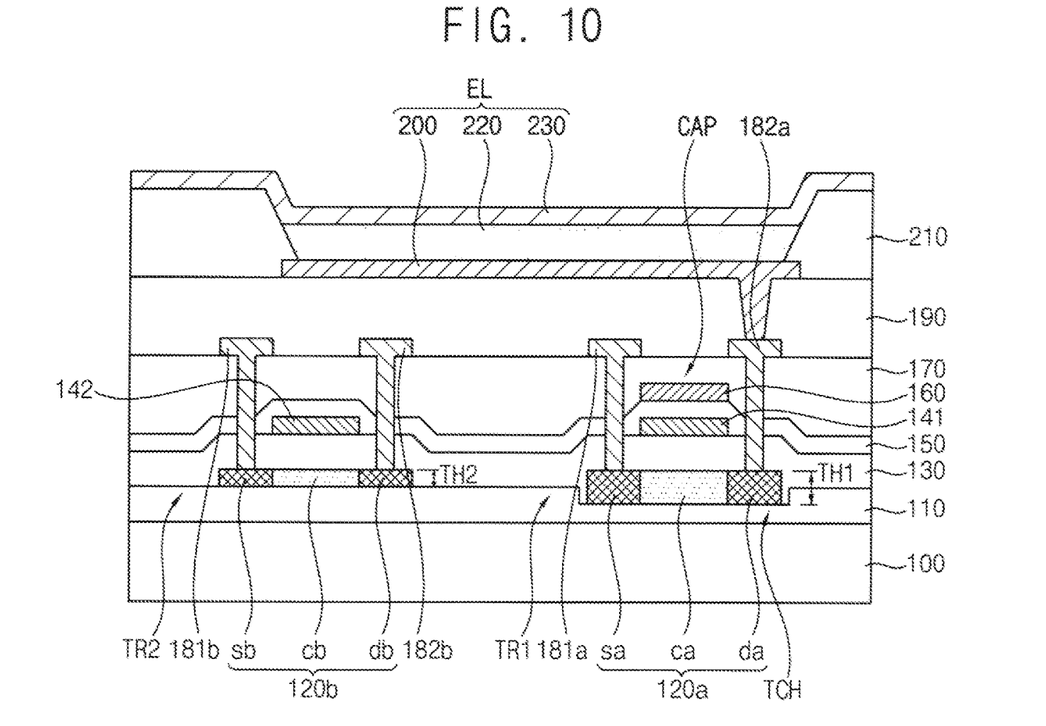
FIG. 10 is a cross-sectional view showing a display device according to one or more embodiments of the present disclosure.

FIG. 10 is a cross-sectional view showing a display device according to one or more embodiments of the present disclosure.

Referring to FIG. 10, according to one or more embodiments of the present disclosure, a display device may include a substrate 100, a buffer layer 110, a first active pattern 120a, a second active pattern 120b, a first gate insulating layer 130, a first gate electrode 141, a second gate electrode 142, a second gate insulating layer 150, a capacitor electrode 160, an interlayer insulating layer 170, a first source electrode 181a, a first drain electrode 182a, a second source electrode 181b, a second drain electrode 182b, a planarization layer 190, a first electrode 200, a pixel defining layer 210, a light emitting layer 220, and a second electrode 230. The display device that will be described with reference to FIG. 10 may be substantially identical or similar to the display device described with reference to FIG. 1 except for the buffer layer 110. Accordingly, descriptions of redundant components may not be repeated.

In one or more embodiments, the distance from the substrate 100 to the top surface of the first active pattern 120a may be substantially the same as or substantially equal to the distance from the substrate 100 to the top surface of the second active pattern 120b. For example, a top surface of the buffer layer 110 may not be flat, and the bottom surface of first active pattern 120a and the bottom surface of second active pattern 120b may be on the top surface of the buffer layer 110 at portions of the buffer layer 110 having different thicknesses from each other. In this case, because the second thickness TH2 of the second active pattern 120b is smaller or less than the first thickness TH1 of the first active pattern 120a, the distance from the substrate 100 to the bottom surface of the first active pattern 120a may be smaller than the distance from the substrate 100 to the bottom surface of the second active pattern 120b. For example, the buffer layer 110 may have a trench TCH that overlaps the first active pattern 120a. The trench TCH may be recessed toward the substrate 100 from the top surface of the buffer layer 110. A depth of the trench TCH may be equal or substantially equal to a value obtained by subtracting the second thickness TH2 from the first thickness TH1.

FIGS. 11-18 are cross-sectional views showing a method of manufacturing a display device according to one or more embodiments of the present disclosure. For example, FIGS. 11-18 may show a method of manufacturing the display device of FIG. 10. In the method of manufacturing the display device that will be described with reference to FIGS. 11-18, descriptions of components that are substantially identical or similar to the components of the method of manufacturing the display device described with reference to FIGS. 1-8 may not be repeated.

Figure 11:
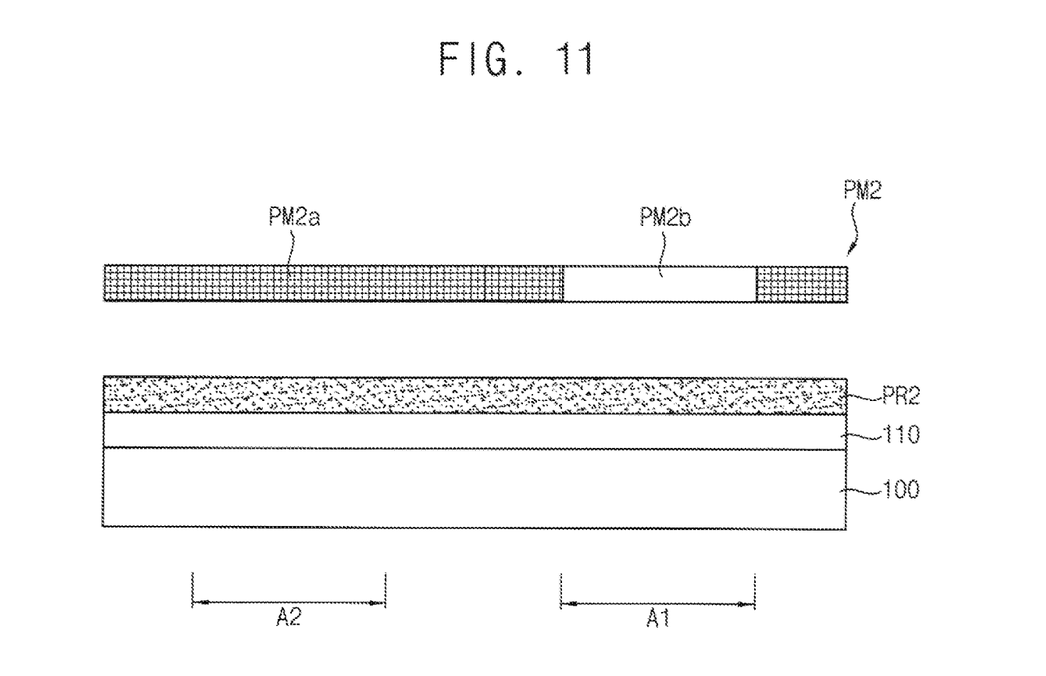
FIGS. 11-18 are sectional views showing a method of manufacturing a display device according to one or more embodiments of the present disclosure.

Referring to FIG. 11, a photoresist layer PR2 may be formed on the buffer layer 110. In one or more embodiments, the photoresist layer PR2 may include a positive-type photoresist. However, the present disclosure is not limited thereto. For example, in other embodiments, the photoresist layer PR2 may include a negative-type photoresist with suitable changes to the processes described herein.

Thereafter, a photomask PM2 may be disposed on the photoresist layer PR2. The photomask PM2 may include a light blocking part PM2a and a light transmitting part PM2b. When the photoresist layer PR2 includes a positive-type photoresist, the light transmitting part PM2b may overlap the first region A1.

Figure 12:
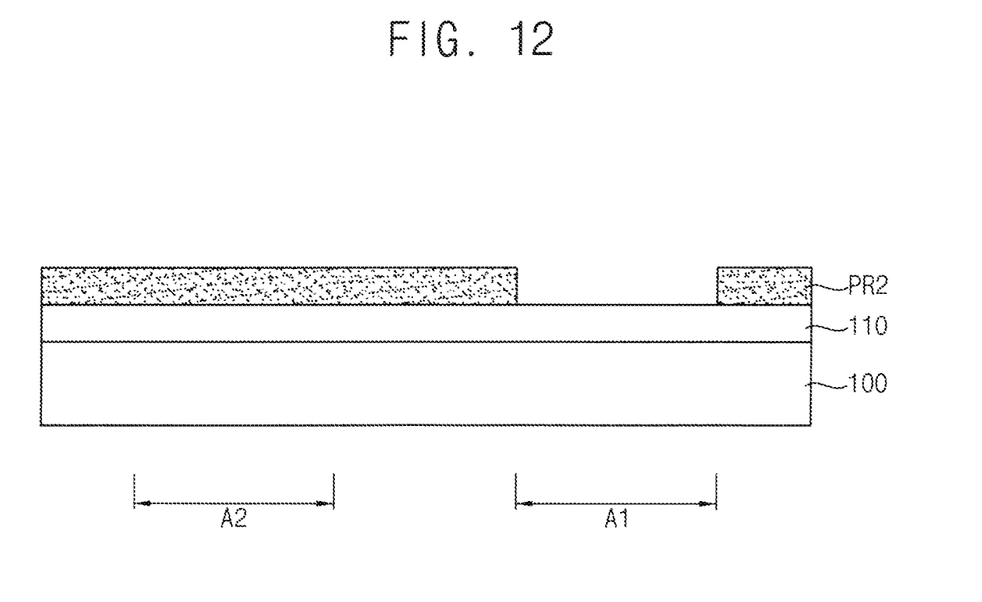

Referring to FIG. 12, portions of the photoresist layer PR2 may be exposed (e.g., exposed to light) by using the photomask PM2. For example, the portions of the photoresist layer PR2 that overlap the light transmitting part PM2b may be exposed and the portions of the photoresist layer PR2 that overlap the light blocking part PM2a may remain unexposed. Then, the photoresist layer PR2 may be developed with a developer to pattern the photoresist layer PR2. In this case, a portion of the photoresist layer PR2 that overlaps the light transmitting part PM2b may be removed. In other words, in the case of a positive-type photoresist, the portion of the photoresist layer PR2 that is exposed may be removed by the developer.

Figure 13:
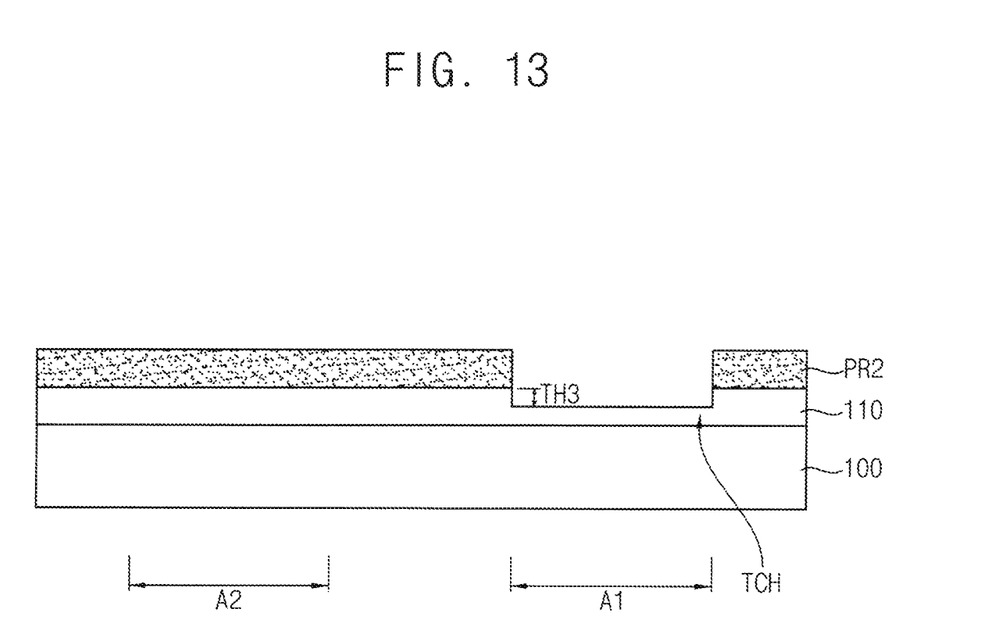

Referring to FIG. 13, the first region A1 of the buffer layer 110 may be partially etched (e.g., partially etched in the thickness direction of the buffer layer 110). The first region A1 of the buffer layer 110 may be exposed or not covered by the patterned photoresist layer PR2, and the first region A1 of the buffer layer 110 may be etched by the third thickness TH3. In one or more embodiments, the third thickness TH3 may be greater than 0 and less than about 60 Å. In this case, a trench TCH having a depth corresponding to the third thickness TH3 may be formed in the first region A1 of the buffer layer 110.

Figure 14:
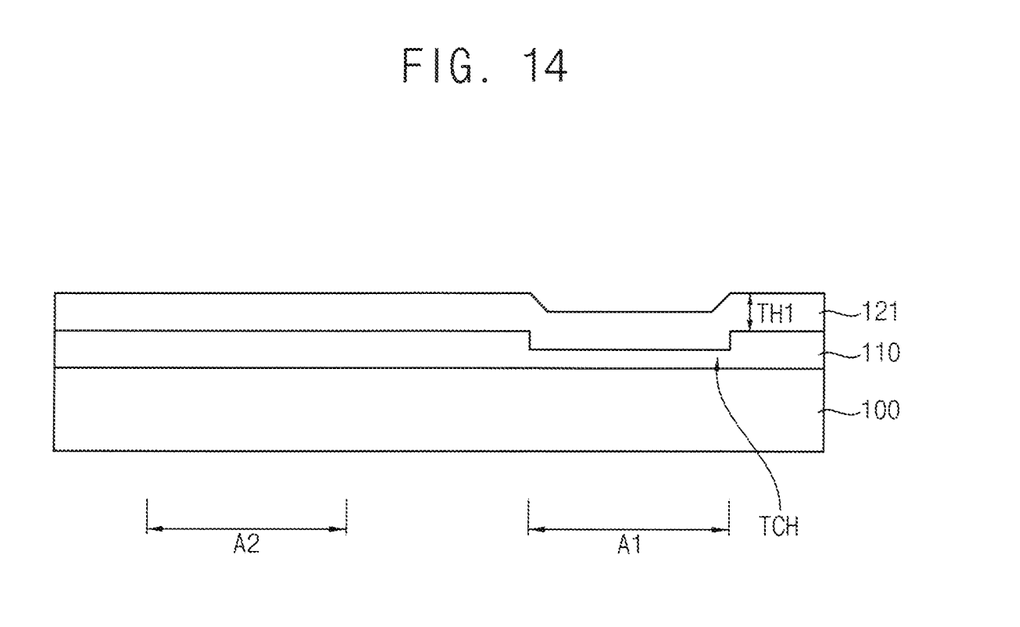

Referring to FIG. 14, the photoresist layer PR2 may be removed, and the amorphous silicon layer 121 may be formed on the buffer layer 110. The amorphous silicon layer 121 may be formed along a profile of the top surface of the buffer layer 110. The amorphous silicon layer 121 may have the first thickness TH1. In one or more embodiments, the first thickness TH1 may be about 300 Å to about 500 Å.

Figure 15:
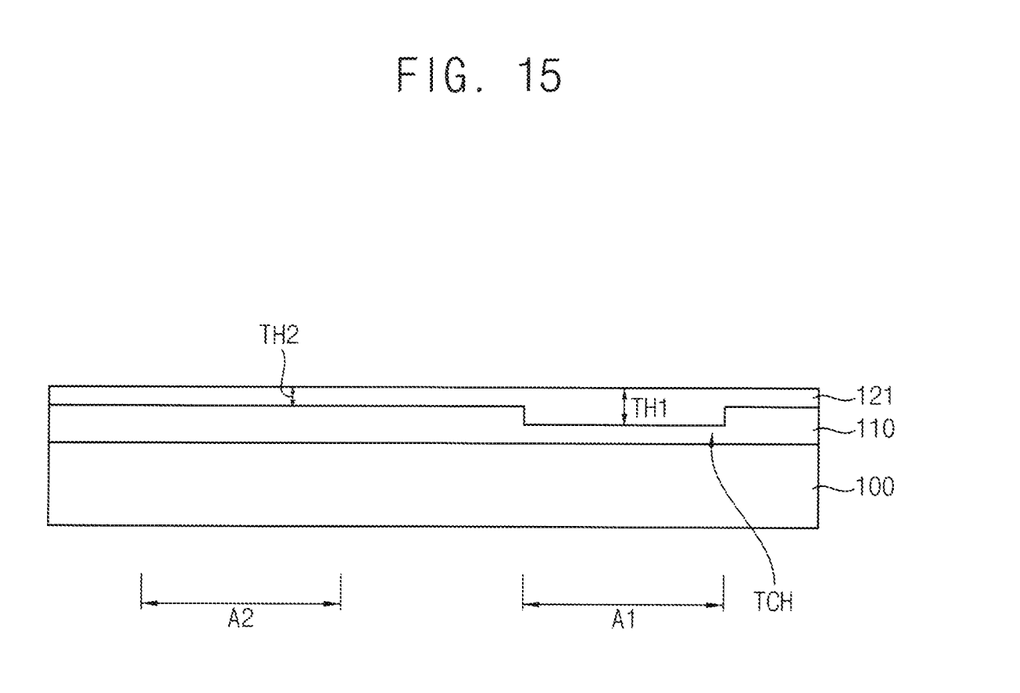

Referring to FIG. 15, the amorphous silicon layer 121 may be polished. For example, the amorphous silicon layer 121 may be polished through chemical mechanical polishing (CMP).

In one or more embodiments, the amorphous silicon layer 121 may be polished by a thickness greater than 0 and less than about 60 Å. In other words, the amorphous silicon layer 121 may be polished by the third thickness TH3 corresponding to the depth of the trench TCH. In this case, the first region A1 of the amorphous silicon layer 121 may not be polished, and a remaining region of the amorphous silicon layer 121 except for the first region A1 may be polished. Accordingly, the first region A1 of the amorphous silicon layer 121 may have the first thickness TH1, and the second region A2 of the amorphous silicon layer 121 may have a second thickness TH2 obtained by subtracting the third thickness TH3 from the first thickness TH1.

Figure 16:
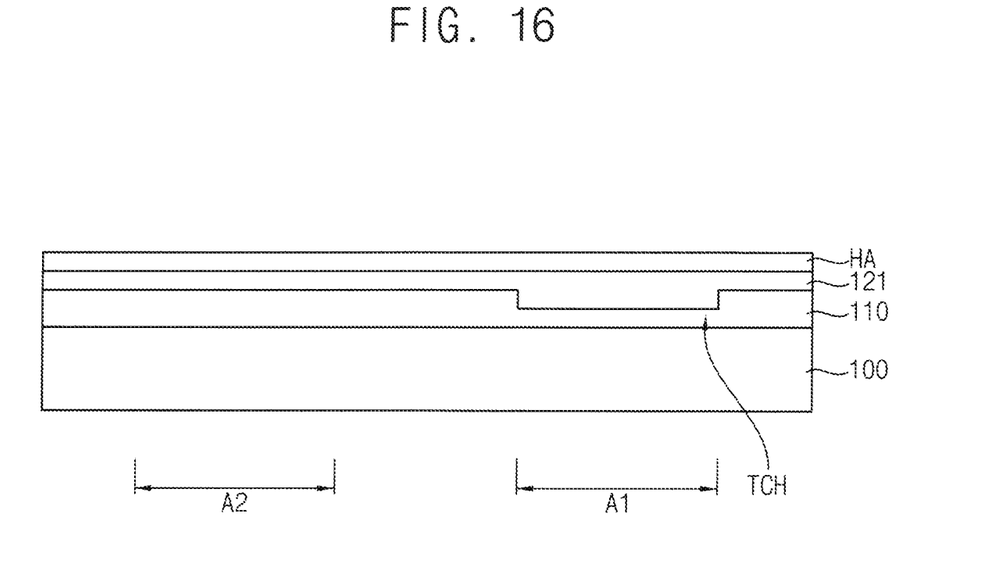

Referring to FIG. 16, the amorphous silicon layer 121 may be washed. The amorphous silicon layer 121 may be washed by using the hydrofluoric acid HA.

Figure 17:
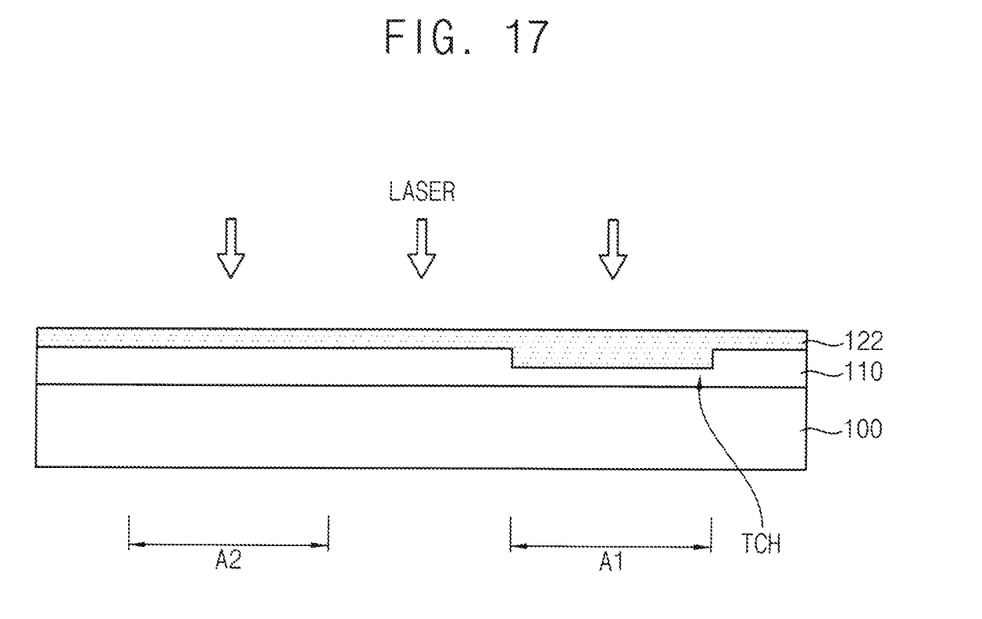

Referring to FIG. 17, the amorphous silicon layer 121 may be crystallized to form the polycrystalline silicon layer 122. The polycrystalline silicon layer 122 may be formed by irradiating a laser onto the amorphous silicon layer 121. In one or more embodiments, the amorphous silicon layer 121 may be crystallized by irradiating a laser having a constant energy density.

Figure 18:
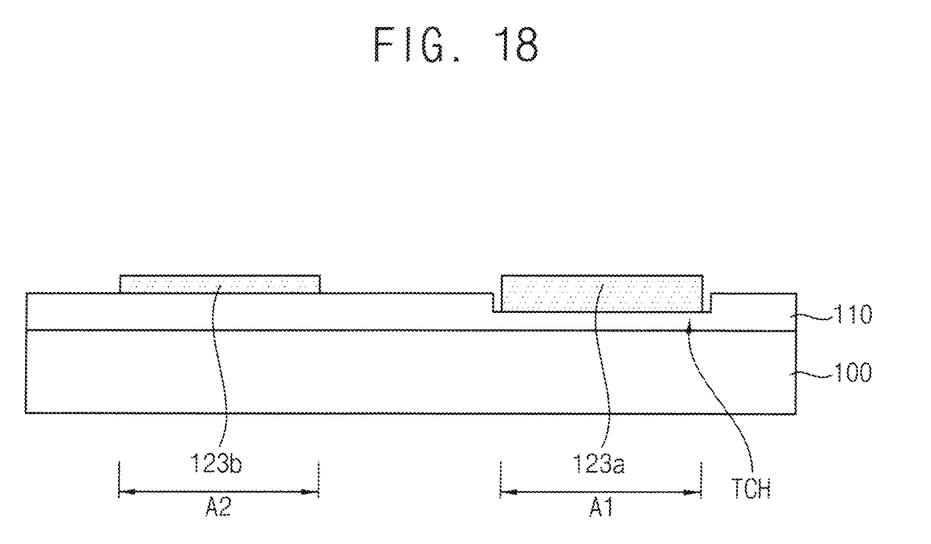

Referring to FIG. 18, all regions of the polycrystalline silicon layer 122 except for the first region A1 and the second region A2 may be etched to form the first polycrystalline silicon pattern 123a and the second polycrystalline silicon pattern 123b in the first region A1 and the second region A2, respectively. The regions of the polycrystalline silicon layer 122 except for the first region A1 and the second region A2 may be etched by the second thickness TH2.

The display device according to the embodiments may be applied to a display device included in a computer, a notebook, a mobile phone, a smartphone, a smart pad, a PMP, a PDA, an MP3 player, and/or the like.

Although the display devices and the methods of manufacturing the display devices according to the embodiments have been described with reference to the drawings, the illustrated embodiments are examples, and may be modified and changed by a person having ordinary knowledge in the relevant technical field without departing from the technical spirit described in the following claims, and equivalents thereof.

What is claimed is:

1. A display device comprising:
   a substrate;
   a buffer layer on the substrate;
   a first active pattern on the buffer layer, the first active pattern having a first thickness;
   a second active pattern on the buffer layer, spaced from the first active pattern, and having a second thickness smaller than the first thickness;
   a first gate insulating layer on the first active pattern and the second active pattern;
   a first gate electrode on the first gate insulating layer, the first gate electrode overlapping the first active pattern;
   a second gate electrode on the first gate insulating layer, the second gate electrode overlapping the second active pattern;
   a second gate insulating layer on the first gate electrode and the second gate electrode; and
   a capacitor electrode on the second gate insulating layer, the capacitor electrode overlapping the first gate electrode.

2. The display device of claim 1, wherein a value obtained by subtracting the second thickness from the first thickness is greater than 0 and less than about 60 Å.

3. The display device of claim 1, wherein the first thickness is about 300 Å to about 500 Å.

4. The display device of claim 1, wherein a distance from the substrate to a bottom surface of the first active pattern is substantially equal to a distance from the substrate to a bottom surface of the second active pattern.

5. The display device of claim 4, wherein a top surface of the buffer layer is flat.

6. The display device of claim 1, wherein a distance from the substrate to a top surface of the first active pattern is substantially equal to a distance from the substrate to a top surface of the second active pattern.

7. A display device comprising:
   a substrate;
   a buffer layer on the substrate;
   a first active pattern on the buffer layer, the first active pattern having a first thickness;
   a second active pattern on the buffer layer, spaced from the first active pattern, and having a second thickness smaller than the first thickness;
   a first gate insulating layer on the first active pattern and the second active pattern;
   a first gate electrode on the first gate insulating layer, the first gate electrode overlapping the first active pattern; and
   a second gate electrode on the first gate insulating layer, the second gate electrode overlapping the second active pattern,
   wherein a distance from the substrate to a top surface of the first active pattern is substantially equal to a distance from the substrate to a top surface of the second active pattern and wherein the buffer layer has a trench that overlaps the first active pattern.

8. The display device of claim 1, further comprising a conductive pattern between the substrate and the buffer layer, the conductive pattern overlapping the first active pattern.

9. The display device of claim 1, wherein each of the first active pattern and the second active pattern comprises polycrystalline silicon.

\* \* \* \* \*